(12) United States Patent
De Bosscher et al.

(10) Patent No.: US 12,351,901 B2
(45) Date of Patent: Jul. 8, 2025

(54) DEPOSITION OF NON-STOICHIOMETRIC METAL COMPOUND LAYER

(71) Applicant: SOLERAS ADVANCED COATINGS BV, Deinze (BE)

(72) Inventors: Wilmert De Bosscher, Drongen (BE); Ivan Van De Putte, Waregem (BE); Ignacio Caretti Giangaspro, Antwerp (BE)

(73) Assignee: SOLERAS ADVANCED COATINGS BV, Deinze (BE)

( * ) Notice: Subject to any disclaimer, the term of this patent is extended or adjusted under 35 U.S.C. 154(b) by 0 days.

(21) Appl. No.: 18/548,418

(22) PCT Filed: Mar. 4, 2022

(86) PCT No.: PCT/EP2022/055504
§ 371 (c)(1),
(2) Date: Aug. 30, 2023

(87) PCT Pub. No.: WO2022/184881
PCT Pub. Date: Sep. 9, 2022

(65) Prior Publication Data
US 2024/0133025 A1 Apr. 25, 2024
US 2024/0229228 A9 Jul. 11, 2024

(30) Foreign Application Priority Data

Mar. 4, 2021 (BE) .................... 2021/5169

(51) Int. Cl.
*C23C 14/54* (2006.01)
*C23C 14/00* (2006.01)
(Continued)

(52) U.S. Cl.
CPC ........ *C23C 14/547* (2013.01); *C23C 14/0042* (2013.01); *C23C 14/083* (2013.01);
(Continued)

(58) Field of Classification Search
None
See application file for complete search history.

(56) References Cited

U.S. PATENT DOCUMENTS 5,614,248 A * 3/1997 Schiller .................. C23C 14/54
204/192.15
8,956,511 B2 2/2015 Scherer et al.
(Continued)

OTHER PUBLICATIONS

Xiaolong Xu et al., "Structure, Composition and Electronic Transport Properties of Tungsten Oxide Thin Film Sputter-Deposited by the Reactive Gas Pulsing Process", Materials Chemistry and Physics, Elsevier SA, Nov. 22, 2017, pp. 391-400.
(Continued)

*Primary Examiner* — Jason Berman
(74) *Attorney, Agent, or Firm* — Workman Nydegger

(57) ABSTRACT

A method of depositing a layer on a piece by sputter deposition, a coater and a processor for controlling a coater in accordance with the method are provided. The method includes providing deposition of metallic and reactive species simultaneously on a piece for forming a layer under predetermined sputtering conditions, thereby providing a deposited layer on the piece comprising a metal compound. The deposited layer is subsequently irradiated and the optical transmittance is measured. A measured parameter related to the measured radiation is compared with one stored value of that parameter. The sputtering conditions are thereby adapted as a result of the comparison.

18 Claims, 5 Drawing Sheets

(51) Int. Cl.
 C23C 14/08 (2006.01)
 C23C 14/16 (2006.01)
 C23C 14/34 (2006.01)
 H01J 37/34 (2006.01)
(52) U.S. Cl.
 CPC ........ *C23C 14/165* (2013.01); *C23C 14/3407* (2013.01); *H01J 37/3426* (2013.01); *H01J 37/3476* (2013.01); *H01J 2237/24585* (2013.01); *H01J 2237/332* (2013.01)

(56) References Cited

U.S. PATENT DOCUMENTS

| | | | |
|---|---|---|---|
| 2003/0059623 A1* | 3/2003 | O'Shaughnessy | C03C 17/245 204/192.15 |
| 2008/0213555 A1* | 9/2008 | Ono | C23C 14/205 428/215 |
| 2016/0070033 A1 | 3/2016 | Schlott et al. | |
| 2019/0127845 A1 | 5/2019 | Shuto et al. | |

OTHER PUBLICATIONS

Belgian Search Report from corresponding Belgian Patent Application No. BE202105169, Nov. 25, 2021.
International Search Report from corresponding PCT Application No. PCT/EP2022/055504, Jun. 10, 2022.

* cited by examiner

DEPOSITION OF NON-STOICHIOMETRIC METAL COMPOUND LAYER

FIELD OF THE INVENTION

The invention relates to the field of sputtering. More specifically it relates to sputtering non-stoichiometric metal compound layers, in particular sub-stoichiometric metal oxide and/or metal nitride and/or metal carbide layers.

BACKGROUND OF THE INVENTION

Control of composition of layers is an important but difficult issue in the manufacture of compound layers. Provision of layers containing compounds, such as oxide layers, require careful conditioning of materials and environment, and good control of the growing parameters. A number of chemical and physical vapor deposition techniques can be used for this purpose. In particular, sputter deposition can provide layers of few nanometers of thickness, which can be used as coatings for several applications.

Deposition via magnetron sputtering is a well-known technique using powered targets under the influence of a magnetic field so that gases in a controlled environment form a plasma track on the target. This results in the removal of material from its surface through plasma ion bombardment and the deposition of sputtered atoms onto a substrate. Where tailored materials require specific properties, a specific composition needs to be provided in the deposited layer, for example in one or more layers of a stack. Sputter deposition can be used to provide multiple layers of possibly different materials, allowing control of composition and thickness of the materials forming each individual layer of a stack. This can be done in different stages. However, control of coating composition is challenging, as changing one deposition parameter usually influences, often in an uncontrollable or unpredictable manner, the rest of parameters.

In order to form an oxide or nitride layer by sputter deposition, metallic targets can be sputtered in "reactive mode", i.e. in an environment not only containing the discharge gas (typically argon), but also reactive gas (e.g. oxygen or nitrogen). Metal is sputtered onto a substrate, and reacts with the surrounding reactive gas forming metal compound layers. Although metallic targets are readily available, they suffer from the well-known target poisoning effect when sputtered in reactive mode. A metal compound film is not only formed on the substrate as desired, but also on the sputter target itself. As a consequence, the sputter yield and thereby the sputter deposition rate is significantly reduced. Moreover, the reactive gas partial pressure presents a hysteresis as a function of the reactive gas flow in the coating compartment. At low reactive gas flows, the process operates in so-called 'metallic mode' and the deposited layers are metallic in character. At higher reactive gas flows, a compound layer is formed on the substrate, but also on the target surface. The process now operates in 'poisoned mode' and the deposited metal compound layers are ceramic in character. The transition point from metallic to poisoned mode may occur at a different threshold reactive gas flow than the reverse transition and depends on the current state of the target surface. Moreover, the transition between both modes is characterized by a steep change in the sputtering process variables, with small changes in the reactive gas flow leading to large variations in the properties of the deposited layers. A working point close to the transition point is thus inherently unstable. This means that a metallic target provides easily either deposition of metallic layers or deposition of stoichiometric metal compound layers. However, deposition of a suboxide layer with a specific non-stoichiometric composition ($MO_x$) or subnitride layer with a specific non-stoichiometric composition ($MN_x$) or subcarbide layer with a specific non-stoichiometric composition ($MC_x$) becomes technically very difficult with a metallic target.

Compared to metallic targets, ceramic targets (e.g. oxide targets) provide more stable operation at their working point because target poisoning and the resultant hysteresis effect are reduced or largely absent. However, manufacture and manipulation of ceramic targets is often difficult because of the high melting point of the raw materials, and poor mechanical properties of these ceramics, such as the relatively high brittleness and high hardness of ceramic coatings. Moreover, oxides are usually not good conductors, so sputtering of ceramic targets is usually more restricted in power than metals and requires the use of power supplies with advanced arc management settings. In case of fully insulating target materials, their use is typically limited to powering with radiofrequency AC during the process, which is costly and less efficient and cannot be easily scaled to large targets and high power levels.

SUMMARY OF THE INVENTION

It is an object of embodiments of the present invention to provide a reliable and sensitive method of depositing layers, in particular sub-stoichiometric metal compound layers, e.g. sub-stoichiometric metal oxide, which allows controlling at least radiation absorption, optionally layer composition, and optionally other parameters of the layer such as thickness and/or density. It is a further object to provide a computer implementation of the method, a computer program configured to carry out steps of an algorithm of the method and a sputtering system including such computer implementation for the performance of the method.

The present invention provides a method of depositing a layer on a piece by sputter deposition. The method comprises:
  providing sputter deposition of metallic and reactive species on a piece for forming a layer under predetermined sputtering conditions, thereby providing a deposited layer on the piece comprising a metal compound,
  subsequently irradiating the deposited layer on the piece and measuring optical transmittance through at least the deposited layer,
  comparing a measured radiation parameter of the radiation transmitted with at least one stored value of the radiation parameter,
  adapting the predetermined sputtering conditions as a response of the comparison.

The present method may provide reactive species from the target material itself, and/or from adding reactive gas flow.

It is an advantage of embodiments of the present invention that accurate non-stoichiometric compositions can be deposited by measuring optical properties which depend of the composition. It is an advantage of embodiments of the present invention that a very sensitive measurement of oxygen quantity can be provided by measuring the transmittance of the deposited layer, at least better than existing chemical or spectrometric analysis for in line measurements.

The method may be done automatically, with no human intervention between at least the step of sputtering and the step of irradiating. The comparison of parameters and adaptation of conditions may be also done automatically.

In some embodiments of the present invention, the at least one stored value corresponds to a reference amount of reactive species in a non-stoichiometric compound of metal with the reactive species, e.g. being oxygen and/or nitrogen and/or carbon.

In some embodiments of the present invention, the at least one stored value corresponds to a reference density of the compound of metal with a reactive species.

In some embodiments of the present invention, the at least one stored value comprises values corresponding to a reference density and/or a reference amount of oxygen in an oxygen-deficient metal oxide.

It is an advantage of embodiments that the composition of the layer can be accurately determined and controlled, optionally or additionally also the density based on optical measurements. This can be done for non-stoichiometric metal compounds, for example the density and/or amount of oxygen in an oxygen-deficient metal oxide layer.

In some embodiments of the present invention, measuring optical transmittance comprises measuring radiation wavelength-resolved transmittance where the radiation has a wavelength ranging from the wavelength of UV radiation up to the wavelength of IR radiation.

It is an advantage of embodiments of the present invention that the level of opacity can be easily estimated for the layers as a function of the composition, in particular of the oxygen content in the deposited layer. It is a further advantage that information regarding other parameters, such as the thickness, density, etc. of the deposited layers can also be obtained from the measurement.

In some embodiments of the present invention, measuring optical transmittance comprises measuring with an integrating sensor the transmittance of radiation generated by a plurality of sources with predetermined wavelength ranges, and/or by a broadband light source. It is an advantage of embodiments of the present invention that measurement of radiation transmittance, such as optical transmittance of visible light, can be done with an unexpensive integrating sensor such as a photodiode.

In some embodiments of the present invention, the method comprises providing a ceramic target comprising at least one metal compound, e.g. metal oxide and/or nitride and/or carbide, for sputtering, optionally being a conductive ceramic target.

It is an advantage of embodiments of the present invention that metal target poisoning is reduced or even avoided. It is a further advantage that dynamic deposition rate and voltage depend on the oxygen reaction in a continuous relationship. It is an advantage of embodiments of the present invention that a conductive target, for example with a resistivity under 1000 ohms·cm, e.g. below 100 Ohm·cm, such as lower than 10 Ohm·cm or even less than 1 Ohm·cm, can be used in mid-frequency or DC sputtering.

In some embodiments of the present invention, providing sputter deposition of metal comprises providing sputter deposition of at least tungsten. In some embodiments, providing sputter deposition further comprises providing a target comprising at least one tungsten oxide. In some embodiments, the method comprises depositing a non-stoichiometric tungsten oxide layer where the ratio of oxygen over tungsten is 2.3 or higher, for example 2.5 or higher, for example 2.7 or higher, and lower than 3, for example 2.99 or lower, for example 2.95 or lower, for example 2.9 or lower. It is an advantage of embodiments of the present invention that a layer comprising metal, e.g. tungsten oxide layer, can be provided with tailored oxygen content for deposition.

In some embodiments of the present invention, the method further comprises sputtering in presence of an ambient containing reactive gas, e.g. oxygen and/or nitrogen and/or containing carbon. For example, sputtering in presence of gas comprises sputtering in presence of a gas containing oxygen and/or nitrogen and/or carbon and an inert gas where the amount of inert gas is larger than the amount of reactive gas; e.g. the fraction of reactive gas flow relative to the total amount of injected gas flow into the sputter process is less than 50%, e.g. less than 40%, e.g. even less than 30%, such as less than 20% of the total gas flow.

In some embodiments of the present invention, controlling the predetermined sputtering conditions comprises controlling the conditions so that the deposited layer has a controlled transmittance being different than the transmittance of the stoichiometric counterpart of the material of the layer. It is an advantage of embodiments of the present invention that a layer comprising non-stoichiometric metal compounds, such as carbides, nitrides or oxides, e.g. non-stoichiometric tungsten oxide, can be reliably deposited.

In some embodiments of the present invention, controlling the sputtering parameters comprises controlling sputtering power, gas partial pressure or flow, and/or magnetic field strength. It is an advantage of embodiments of the present invention that the non-metallic element of the layer, e.g. the content of reactive species, e.g. oxygen content, of the layer can be accurately controlled in order to confer to the layer a metallic or ceramic character.

In some embodiments of the present invention, the method may comprise a pre-step of measuring optical transmittance of the piece before providing sputter deposition for forming a deposited layer on the piece, thereby providing a preliminary measurement. The method may also comprise controlling the predetermined sputtering conditions before providing sputter deposition as a response to the preliminary measurement. It is an advantage that the conditions of the piece can be obtained and accurately measured for establishing a reference measurement, which can be used to correct the measurements after deposition.

In some embodiments of the present invention, measuring optical transmittance comprises measuring in reflection mode with the sensor and the radiation source arranged at the same side of the piece. It is an advantage of embodiments of the present invention that layer transmittance can be measured and the sputtering conditions can be controlled even in pieces which have low transmittance or which are opaque.

In a further aspect, the present invention provides a processor comprising input for introducing transmission measurement data, output of data for actuator control, for controlling sputter parameters (including sputter power, gas flow, etc.). The processor is configured, adapted or programmed to perform the method of the first aspect. It may include any of a database, instructions with algorithms, etc. It may comprise an electronic unit for processing data, e.g. a processing unit, e.g. a microprocessor.

In a further aspect, the present invention provides a sputter deposition coater for depositing layers. The device includes actuators for controlling sputter parameters, a sensing system including a radiation source for sending radiation through a layer deposited on a substrate and a sensor for detecting radiation passing through that layer. It also includes the processor of the previous aspect, being connectable or connected to the sensing system and to the actuators for controlling the actuators in response to the measurements obtained from the sensing system.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
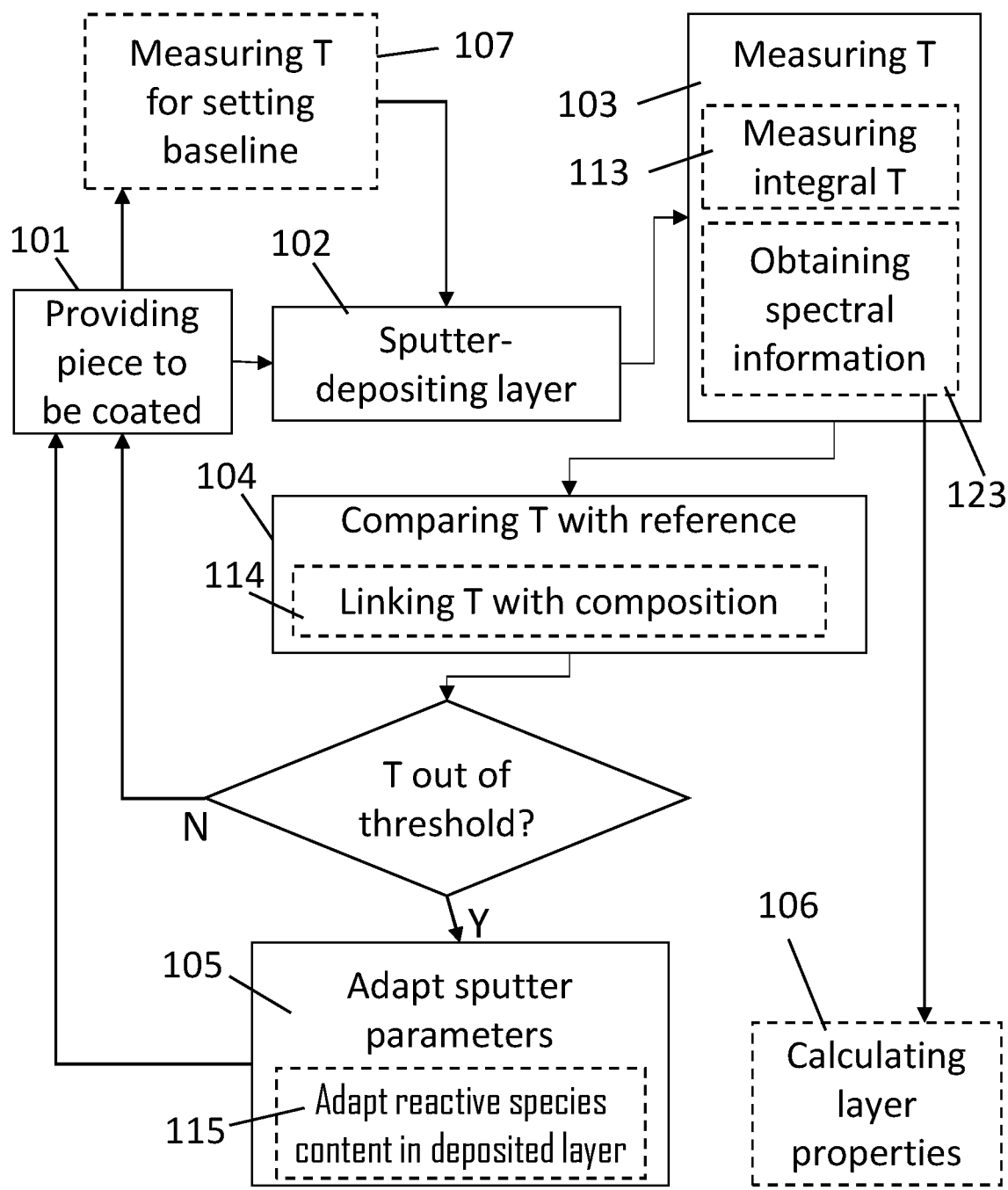
FIG. 1 is a flowchart of the method of depositing layers by sputter deposition with sputtering parameter control in accordance with embodiments of the present invention

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "ceramic target", reference is made to a target including a metal and a further non-metallic element or elements. In some embodiments of the present invention, a ceramic target includes a metal oxide $MO_y$, where the amount of oxygen 'y' of the target material is closer to the stoichiometric index than it is to 0. For example, for $NiO_Y$ or $ZnO_Y$, the content of oxygen 'y' may be typically between 0.7 and 0.99; for $TiO_Y$, $SnO_Y$ or $ZrO_Y$, the content of oxygen 'y' may be typically between 1.6 and 1.97; for $In_2O_Y$ or $WO_Y$, the y may have a value between 2.3 and 2.99; for $Ta_2O_Y$ and $Nb_2O_Y$, the y value may be between 4 and 4.98. However the present invention is not limited to metal oxides, and other metal compounds may be provided. For example the ceramic target may comprise a metal nitride, an oxynitride, etc.

Where in embodiments of the present invention reference is made to "piece", reference is made to an object to be sputtered. This may be a substrate, e.g. a glass, or a substrate with a coating, for example a substrate with one or more layers of deposited material. A piece includes a surface that receives sputtered material. For example, a piece may be an uncoated substrate or a substrate coated with a layer or a stack.

Properties of materials can be tailored by adding a layer or a layer stack by sputtering on the surface of the piece. For example, metal compounds can be deposited on the surface as thin layers. Some properties of materials, such as those of some metal oxides and nitrides, may change dramatically with a small variation of their composition, e.g. with the presence of dopants or vacancy defects. Providing required small variations can be challenging, because a variation of the composition in the gas, or the composition of targets, or in general of most process parameters, usually influences the rest of parameters. This often happens in an uncontrollable or unpredictable manner. The present invention provides feedback control by providing optical analysis. In particular a parameter related to light that passes or is absorbed by, at least, a deposited (thin) layer is measured and compared with expected values. The parameter is an optical transmittance parameter, for example but not limited to transmission. Based on the results of the comparison, the sputtering parameters can be changed, so that the following deposition step may result in a layer with optical characteristics closer to the desired characteristics, depending on the results of the comparison. Additionally, the measurement data can be linked to a value of composition of the deposited layer, e.g. the amount of non-metal element on a metal compound layer.

It is noted that the deposition is performed in a suitable coater, and the optical analysis and feedback control are performed in line with a coater where the deposition takes place. No human manipulation is required in the steps of analysis or between the steps of sputtering and analysis.

In a first aspect, the present invention relates to a method for providing at least one layer by sputter deposition under predetermined, for example known, process parameters. The method includes measuring and analyzing the radiation transmitted at least through the deposited layer and comparing it with a desired value of a parameter derived from the transmitted radiation. Said value may be stored in a memory unit. The method also allows correcting the sputtering conditions, for example by adapting deposition parameters in order to optimize deposition, based on the comparison, in order to provide a piece with a deposited layer with properties such that the radiation transmitted is closer to the desired value. The method allows controlling the absorption of a deposited layer by optimization of the sputtering conditions. In particular, providing an accurate amount of a non-metallic element in a layer formed by a metal compound. This changes the absorption properties of said layer.

Where in embodiments of the present invention reference is made to 'radiation transmittance' or 'optical transmittance' in the description and claims, reference is made to the fraction of incident radiation power transmitted through a material. Across the present description, the measurement of radiation transmittance refers to the measurement of any of these parameters of the radiation transmitted through at least the deposited layer, for example the measurement of transmittance as a function of the radiation wavelength, or the total transmittance for the integral wavelength range provided by the source. It is to be noted that the reflectance, transmittance and absorption follow the relation R+T+A=1. The influence of the surface reflectance can be compensated by calibration, theoretically, by measuring it for a given material, for example for a thin film, so the absorption can be obtained from the transmittance. These two parameters are linked to, and depend on, the thickness, porosity, and composition of the layer, among others, so these layer parameters can be inferred by the measurement of the transmittance.

In some embodiments, the at least one stored value is linked to a composition in the layer, for example to an amount of oxygen as part of an oxide in the layer. In particular, the amount of oxygen may be the oxygen present in an oxygen-deficient non-stoichiometric metal oxide, since transmittance is very sensitive to, not only the thickness, but also to the composition, in particular to oxygen content in metal oxides. This is only an example, and the stored value or range thereof may be linked to a substoichiometric value or range thereof, of nitrogen in a nitride, oxygen and nitrogen in an oxynitride, of carbon in a carbide, etc.

In some embodiments, the method includes adapting the power of the sputtering, and/or the composition of the gas in the deposition environment, and/or the duration of sputtering, and/or the magnetic field, for the following deposition, in response to a measurement of radiation transmittance indicating that the previous deposited layer is too opaque or too transparent, the changes being provided to change not only layer thickness but additionally or alternatively composition, in particular its stoichiometry.

It is noted that at least the steps of providing deposition and irradiating the deposited layer on the piece can be done sequentially with no human intervention, for example automatically, by using known automatized process devices. In some embodiments, all the steps of the method are carried out automatically, including the feedback loop and adapting the parameters. In some embodiments, the deposition is performed in a coater at a pressure different from the atmospheric pressure and with tailored compositions, and the method steps are performed sequentially, without requiring the coater to change to atmospheric pressure and with the atmospheric composition. In other words, there is no need to completely open the coater and no need that user manipulates the piece.

In some embodiments, the method of the present invention allows an uncoupled measurement of the composition and, independently, at least a single additional layer property; e.g. the thickness of the layer or optical properties, such as refractive index or extinction coefficient.

FIG. 1 shows a flowchart of an embodiment of the method with optional steps in dashed boxes. The method includes providing 101 a piece to be coated, depositing 102 by sputter deposition at least one layer of material thereon, for example one layer. Depositing 102 comprises providing metal and a reactive species such as oxygen, for example sputtering metal or a metal oxide optionally in presence of oxygen in the environment. The method includes subsequently measuring 103 radiation transmittance, for example the percentage of light transmitted as a function of wavelength, and comparing 104 the measurement with at least one reference value of transmittance. The method includes adapting 105 the predetermined process parameters if the measurement is outside a predetermined range (for example, if it falls under a minimum value). Thus, the process parameters can be corrected for further deposition steps, for example for deposition in subsequent pieces. The composition of the layer of the subsequently piece to be coated, for example the oxygen content in the layer, can thus be controlled.

Providing 101 the piece may comprise providing an uncoated substrate, or a previously coated substrate with known transmittance, or a substrate including a coating layer or layer stack provided in-line, with known transmittance, e.g. measured transmittance.

Some applications require a substrate with accurate and known optical properties, such as transparency. The method allows measuring radiation transmittance after deposition of a layer, and comparing it to a desired value or range thereof. The desired value or range may be stored in a memory. The method allows correcting the deposition parameters, if the transmittance does not fit a desired range (for example if it is larger, or smaller, than the desired value). In some embodiments, if the transmittance is lower or higher than expected within a range, the parameters can be corrected for a subsequent sputtering, for example on a different piece or on the same piece.

As an example, if the transmittance is lower than a predetermined value, or lower than any of the values of a range thereof around a preferred value, then the sputtering parameters of the next piece to be sputtered are changed in order to provide higher transmittance. For example, a thinner layer may be provided, e.g. by reducing the sputtering power during the deposition process. For example, a higher oxidic content in the layer may be provided, e.g. by increasing the oxygen gas flow during the deposition process. For example, other parameters of the process may be varied, e.g. by changing the magnetic field strength, or e.g. by changing the gas partial pressure, or e.g. by changing the dwell time in front of the coating zone, or by any other process parameter that may result in a higher transmittance. If the transmittance is higher than anticipated, then any single or multiple parameters may be adjusted preferably in an opposite way.

The difference between the expected value or range and the measured value may be used to determine how much the deposition parameters should be adjusted. This may be based on calibration references stored in the memory, for example, or based on theoretical calculations. The present invention is not limited to these. For instance a learning algorithm can be applied to improve adjustments of the sputtering conditions, advantageously taking into account interdependency of the sputtering conditions experimentally. Some applications, additionally, can benefit from the measurement of chemical composition of the deposited layer. Chemical composition may impact many layer properties; e.g. structural (e.g. layer morphology or crystallinity), mechanical (e.g. layer stress or hardness), electrical (e.g. carrier density and mobility) and optical (e.g. overall or spectral transmittance or absorbance) performance. Transmittance is related to at least the composition and thickness of the layer. As the elements being sputtered are known, the transmittance and thickness can be an indicator of the quantity of the elements in the layer. The layer thickness can be measured after or during sputtering by any suitable means, or it can be calculated (based on accurate calibration of deposition time and such), so it is possible to link transmittance to a specific quantity of the elements being deposited. Hence, optionally the method may include additionally linking 114 the measurement with at least one stored value which corresponds to a particular composition. Optionally the particular composition is a non-stoichiometric metal compound, for example but not limited to an oxygen-deficient oxide. In some embodiments of the present invention, the amount of oxygen being incorporated in the deposited layer may be controlled and adjusted if the measured transparency is outside the acceptance threshold, to provide a layer with more or less transmittance. An oxygen deficient layer will typically exhibit some degree of absorption. Higher absorptance reduces transmittance (since $R+T+A=1$). So a reduced transmittance as a result of a substoichiometric oxide layer is directly related to both the degree of sub stoichiometry and its layer thickness: thicker layers will generate more absorption and less transmittance, for a given fixed composition.

In embodiments of the present invention, one or more suboxide compositions of a metal oxide can be linked 114 to a corresponding transmittance value stored in the memory unit. Upon comparing the measured transmittance with the stored value linked to a particular composition, it is possible to infer the actual composition of the layer. It was found that a very accurate measurement of the composition can be obtained, as it seems that the effect of the composition can be very important in the transmittance of an oxide. Thus, complex dedicated chemical spectrometry setups such as Rutherford backscatter spectrometers or X-ray photoelectron spectrometers, which are expensive and difficult to integrate in a sputter deposition setup, are not required to obtain the composition of a deposited layer. The present invention allows chemical composition analysis with no need of an expensive setup, which can be provided in-line, by providing a sensing system capable of measuring the radiation transmittance and a suitable processor which is configured to analyse transmission data.

The approach of the present method allows controlling the transmittance of a layer in a flexible and accurate way, e.g. with no need of varying the thickness of the deposited layer, or even with combining it with thickness variation for a wide range of accurate control. For example, a sputtering process which provides an optimal thickness, but a suboptimal transmittance, can be controlled and changed so that the composition changes, allowing control of transmittance, with no need of changing the thickness of the layer.

Figure 3:
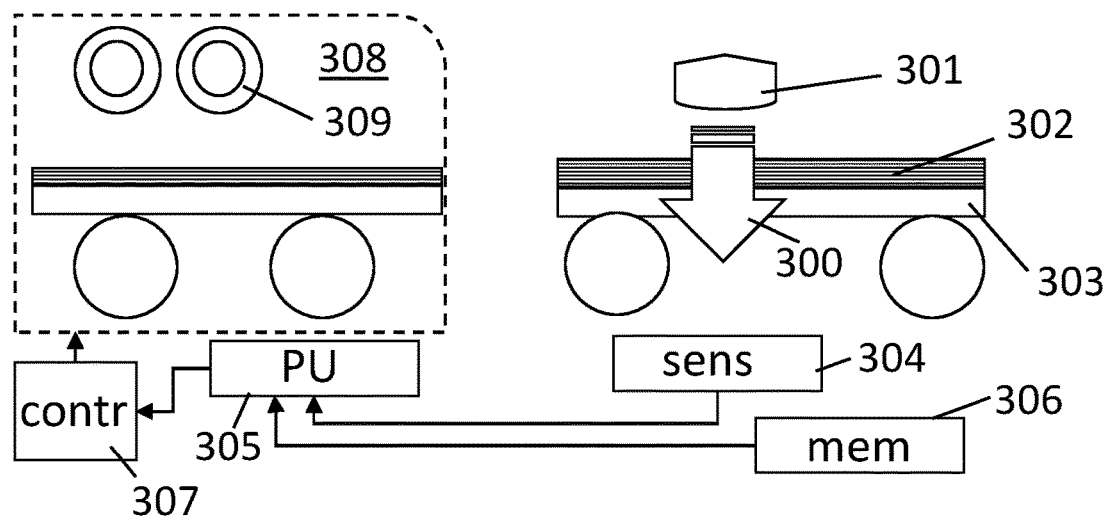
FIG. 3 illustrates a sputtering device including a sensing system in accordance with embodiments of the present invention.

In order to measure the radiation transmittance, a sensing system can be used including at least one radiation source and at least one sensor. FIG. 3 shows an example of such setup, including a coater with a sputtering chamber and sputtering targets. The coater compartment 308 may include a sputter target system, for example planar or tubular targets 309, which may be metallic, or may be ceramic for example. The coater compartment 308 is followed by a measurement region where the piece, after sputtering, can be placed, e.g. automatically. In other words, after sputter deposition, the piece reaches the sensor 304. In this measurement region, radiation 300 from a source 301 can pass through the piece including a deposited layer stack 302 (which may comprise only one layer or several of same or different materials and compositions) after deposition in the coater compartment 308. Radiation may pass also through the substrate 303 of the piece which in some embodiments may be transparent for the radiation 300. The sensor and the radiation source may be at opposite sides of the piece for measurements in transmission mode. In some embodiments, the radiation source impinges directly on the layer which was deposited. In some embodiments, the radiation source may impinge radiation on the surface of the substrate opposite to the surface where the layer was deposited. The signal obtained in the sensor 304 is sent to a processor 305 which provides the value of transmittance corresponding to the signal and compares it to at least one value stored in a memory 306, for example a desired value or set thereof. If the measured value is very different from the desired value, the processor may send the signal to a controller 307 to change 105 the sputtering conditions of the coater compartment 308 used to provide a layer from the layer stack 302, in accordance with the result of the comparison.

The present invention provides control of deposition parameters of at least one layer of the stack. Adapting 105 the sputtering conditions may comprise adapting the power supply settings or power delivery, the race track angle width and orientation, the intensity of the magnetic field, for example. The geometry in the coater may be tuned e.g. by moving the piece, the shields or the sputter sources in the coater. In embodiments of the present invention, adapting the conditions comprises adapting the amount and/or type of gas in the atmosphere of the chamber. For example the partial pressures can be changed. The partial pressure will be a result of the gas inlet, pumping capacity and their relative geometry in the process chamber; e.g. gas flow may be lowered if pumping capacity is decreased as well; while maintaining the same pressure regime. For example, the method may comprise adapting 115 the amount of reactive species in the environment, for example by adjusting the amount of oxygen or nitrogen that is delivered to (e.g. by valves, or mass flow controllers) or that is extracted from (e.g. by pumping or by gettering from the reactive process) it. For example, the method may comprise adapting 115 the amount of target material arriving on the piece, for example by adjusting the power level that is delivered to the target (as reactive species may be provided by a target material, e.g. from a ceramic target). For example, adapting 105 the sputter parameters and in particular adapting 115 the reactive species may comprise adapting the plasma density in front of the target, for example by adjusting the magnetic field strength and impacting the local collision density of electrons with gas particles. Each of the previously mentioned sputter parameters may be adjusted individually or in combination as to adapt the content of reactive species in the layer in the following piece to be coated, or in the following coating step of the same piece. The controller 307 or controllers may be configured to control actuators for actuating valves and/or the powering of electromagnets, etc.

Turning to the sensing system in more detail, depending on the sensor 304, different information can be obtained from the measurement. For measurements where the layer thickness is known or can be measured by a dedicated measurement system, the sensor system may include a simple integrating photosensor, and a broadband (e.g. a white light source) or small band (e.g. specific color LED) radiation source can be included.

Hence, in some embodiments of the present invention, measuring transmittance 103 may include measuring 113 integral transmittance of one or more radiation sources, using an integrating sensor which measures the transmittance for a wide range of wavelengths. In this case, the fraction of total radiation transmitted through the piece is measured (as a single value). If the light source is broadband (e.g. halogen lamp), then information of overall transmittance is obtained in that broad wavelength range. If the source has narrower band, e.g. a red LED, having a spectral output close to 630 nm and a spectral band width of +/−30 nm (i.e. Gaussian curve starting at about 600 nm, maximum at 630 nm and ending at 660 nm), then only integrated spectral response is measured for that specific wavelength window. However, an additional, e.g. different source may be integrated in parallel, for example another LED light source 301, e.g. green (wavelength range around 560 nm) and/or blue (range around 480 nm). It may be possible to obtain several integrated transmittance values, corresponding to the wavelength content of the source. This may be done, for example, by providing sequential irradiation, for example by triggering the sources one after the other and synchronize the measurements with the sensor 304, so that the transmittance response can be linked to the corresponding source with a known small wavelength band. The photodiode always performs a full integration of any light arriving to it; so the source is defining the spectral content.

The advantage of using an integrating sensor, such as a photodiode, is their wide availability and inexpensive setup required.

Because optical transmittance measurement can be spectrally selective and show a value of transmittance for multiple individual wavelength values or ranges thereof, it is possible to use spectral information of the transmitted radiation. Hence, measuring transmittance may include obtaining 123 spectral information of the transmitted radiation. In other words, it is possible to measure radiation wavelength-resolved transmittance. The radiation may have a wavelength ranging from the wavelength of UV radiation up to IR radiation. This can be used to study thickness of the deposited layer, for example. As mentioned earlier, thickness can be obtained by a dedicated measurement system such as an electrical system or the like, or it may be inferred through theoretical calculations and calibration from e.g. the deposition time. However, in some embodiments, the method may include calculating 106 properties of the layer, for example properties of the single layer or of multiple layers. These properties may include refractive index, extinction coefficient, porosity and density, thickness, etc. from the measurement of the radiation transmission itself. Integrating measurements can still define composition, e.g. the amount of oxygen in an oxygen-deficient metal oxide, for a given and/or known thickness. By contrast, a spectral measurement allows to deduct additional layer parameters; e.g. layer thickness, even optical properties such as e.g. spectral refractive index and extinction coefficient. For example, thickness of the layer, and related data, can be extracted from spectral analysis of the transmitted radiation. In other words, the spectral transmittance curve on its own may be sufficient to calculate layer thickness. Having an interference pattern may suffice and be used to tune the process parameters as to adjust the layer thickness (additionally to the composition; specific quantity of the elements being deposited). This will be discussed below with reference to FIG. 4.

Optionally, the method may include additionally measuring 107 transmittance before layer deposition, in order to set a baseline or initial condition. This step is optional because setting the baseline may be done theoretically. For example if the layer deposition is performed on a well-known piece, it is only needed to know the transmission after deposition. For example, for a naked substrate such as an uncoated glass, where the transmission is known or can be measured in beforehand, the known transmission can be taken into account in the stored values or in the data processing.

In some embodiments, the measurement of transmittance is performed by impinging radiation on a surface of the piece and observing the light leaving the opposite surface, which means that the piece needs to be placed after sputtering between the radiation source and the sensor, as described earlier. However, the transmittance measurement can be performed even in reflection mode, if the piece presents a very low transmittance.

For example, some applications include fabrication of mirrors, such as active mirrors. For the fabrication of active mirrors, the piece to be coated may be a high quality mirror (e.g. having a sufficiently thick layer of Ag or Al on a substrate, e.g. on a glass or metal plate). In this case, spectral reflectance is an important parameter, while transmittance may be too low to be accurately measured on the piece. However, the present invention still allows the use of transmittance measurement to define and control the composition of the $MO_X$ layer. In this case, it is possible to set a baseline, preferably by measuring the reflectance of the piece (which may be very high), although it could be done in a theoretical way, or as a premeasurement. After sputter depositing the layer, e.g. the non-stoichiometric oxide layer, the reflectance is measured (or measured again). The effect of the double transmittance, due to the radiation entering the deposited layer and being reflected back, can be extracted from the measurement of the layer to be controlled. In this case, the method may include calculation, e.g. a calculation algorithm, which needs to take into account the interference taking place from the reflection at the top surface of the coated piece and from the radiation being reflected at the interface between the sputter deposited layer and the piece before coating. Again, this reflectance pattern may allow calculating single or multiple layer properties based on double or multiple traverse radiation through the deposited layer, while using the baseline optical data, in this case the reflectance. So, the layer quality is still evaluated on transmittance data (radiation going through the deposited layer, e.g. the non-stoichiometric oxide layer or layer stack including such layer), while the real measurement is a reflectance measurement.

For example, in another large field of applications, a sputter coating is being provided on a flexible substrate, e.g. a PET or PI or any type of foil, which can even include flexible glass. Such coating systems are often referred to as web coaters or roll-to-roll coaters while the substrate is unwound from a roll, transported through the coating zone and finally rewound on another roll. In such a typical coater, the flexible substrate is guided over rollers and when being brought to the coating zone being wound over a cooling drum. Indeed, many polymer flexible substrates may allow limited temperature increase starting to deform; e.g. stretch or forming wrinkles, consequently impacting the quality of the deposited film. While sputter deposition may generate a significant amount of heat load to the substrate, originating of the film condensation, impinging particles and radiation from the plasma; special precautions need to be taken to control the temperature. Winding the substrate over a cooled cooling drum may extract sufficient amount of heating energy from the substrate to allow stable sputter deposition without having significant substrate deformation. In many cases, the substrate and the deposited coating exhibit a significant portion of transmittance as they can be used in many applications: e.g. as window film (requiring lamination to a window to control visual and heat transmittance), e.g. as a laminate in a touch screen for mobile devices, e.g. as an antireflective coating for a display, e.g. as a gas or moisture barrier for food packaging and in many other cases. Controlling the layer properties of the sputtered non-stoichiometric metal compound layer is essential in this case as well. Measuring the transmittance through at least the deposited layer cannot be done easily close to the sputtering compartment by putting the radiation source and sensor at opposite sides of the flexible substrates. The substrate is spanned over a metallic cooling drum. However, in most cases, the cooling drum has a highly reflective and polished (low roughness) outer surface for optimizing heat transfer between the cooling system and the substrate, being heated by the deposition process. Although the piece, e.g. foil, possibly having at least one coating, exhibits transparency, reflectance measurements may be executed while using the cooling drum as reference and calibrated reflection surface in order to define the (double) transmittance of the radiation through the layer that requires measurement and control. The same reasoning as for the mirror above applies; however in this case the reference reflection surface is not a part of the piece to be coated.

Thus, for this reflection configuration, the sensor and the radiation source are arranged at the same side of the piece, e.g. both of them face the surface with the deposited layer.

This also allows measuring pieces which are not transparent or with very low transparency, for example transparent layers deposited on non-transparent substrates.

A reflection measurement may be used to evaluate the transmittance of the layer stack as well as long as the stack 302 exhibits sufficient transmittance for the radiation 300. In the case of reflection; then the incoming radiation will typically form an angle from normal relative to the surface (preferably as small as possible; e.g. less than 15 degrees, e.g. less than 10 degrees, such as 7 degrees). The detector will then be placed preferably close to the specular position, thus having a similar angle symmetric to the normal of the incident angle as to capture an optimal signal of the reflected radiation. The reason of non-normal positioning in reflection measurements is often from a practical point of view, as source and sensor are often two physical units and need to be placed next to each other. However the present invention is not limited by the angular configuration in reflection, and other angles can be used.

Optionally, the method may include depositing one or more layers in a stack, subsequently measuring transmittance before layer deposition, subsequently measuring transmittance after deposition. Measurement before the zone where the $MR_X$ layer, M referring to the metallic component (s) and R referring to a single or multiple reactive component (e.g. oxygen, nitrogen, carbon) of the compound, will be deposited may be advantageous to understand and compensate for uncontrolled variations of the piece, e.g. in the layer or layers deposited upstream in a coater.

Figure 2:
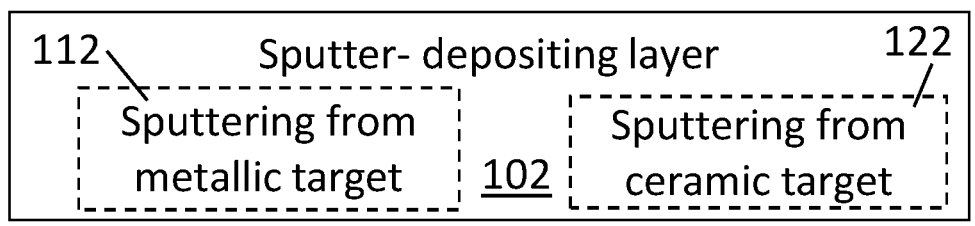
FIG. 2 illustrates a detail of the method of FIG. 1

The method includes providing metal by sputtering and providing a non-metal element on the deposited layer simultaneously. In some embodiments as shown in FIG. 2, depositing 102 a layer by reactive sputter deposition comprises sputtering 112 metal using a metallic target in an environment comprising e.g. oxygen. In some embodiments the metallic target comprises one highly pure metal, e.g. tungsten or nickel. Alternatively the metallic target may comprise an alloy metal target, e.g. a nickel-tungsten alloy (NiW) target.

Optionally, the sputter deposition comprises depositing 122 with at least one ceramic target. Such target can provide the metal and the non-metal elements simultaneously by sputtering. The ceramic target may have a single piece of material for sputtering, with no grooves. In some embodiments the material for sputtering is conductive, allowing sputtering at sub-RF frequencies. It may contain a substantial amount of oxygen-deficient metal oxide or compounds thereof.

Figure 4:
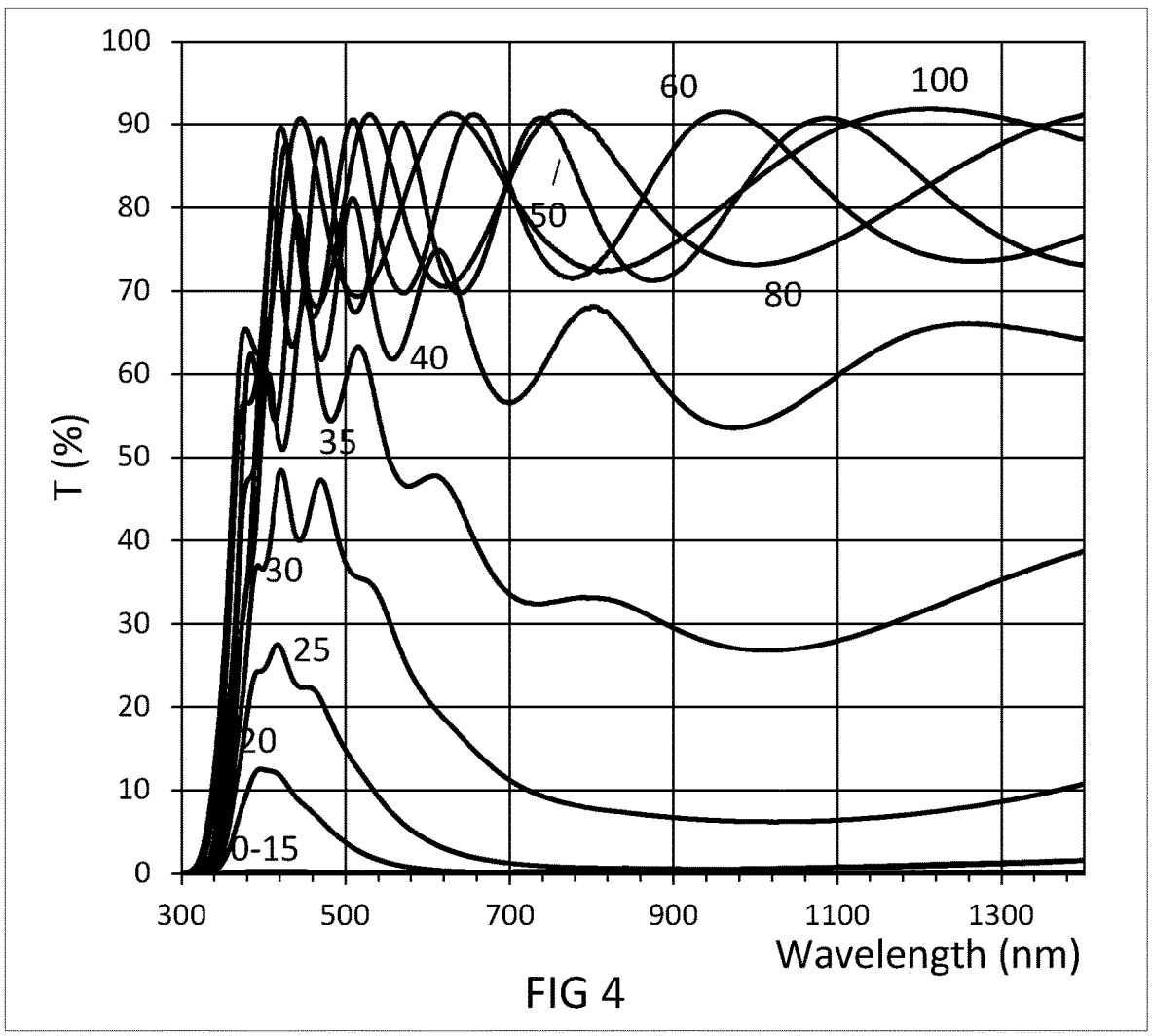
FIG. 4 is a graph illustrating transmittance as function of wavelength for different layers provided in respectively different oxygen flows in standard cubic centimetre per minute (sccm).

In a particular example, a tungsten oxide layer is deposited in a controlled environment with an amount of oxygen, which can be varied. The rest of sputtering conditions are known. The target is a ceramic target (a metal oxide target). The transmittance is measured after a deposition step. The transmittance as a percentage of radiation transmitted through the coated piece as a function of the wavelength is shown in FIG. 4, for nine different amounts of oxygen. While the amount of oxygen flow is different in each case, the rest of deposition conditions are substantially the same for all the measurements (for example, the slight change in pressure with changes of the flow can be neglected or calculated if required).

On purpose, oxygen-deficient tungsten trioxide $WO_X$, where x is lower than 3 and higher than 2, for example 2.3 or higher, for example 2.5 or higher, for example 2.7 or higher, and lower than 3, for example 2.95 or lower, for example 2.9 or lower, may be produced during the sputtering process. Sputtering in a pure Ar gas ambient may have the tendency to further reduce (lowering the x-value of) the layer composition relative to the target composition. In the example of FIG. 4, a $WO_Y$ target is provided with an y-value close to 2.8. Sputtering in pure Ar gas reduces the layer to be formed on the piece. For example, it has been found that a deposited layer is a sub-stoichiometric oxide $WO_X$ with x close to 2.1, which means that during the sputter deposition process, a pumping of oxygen from the target takes place. This results in a metal-richer layer being deposited. Adding oxygen during the sputtering process may increase the oxygen content of the layer relative to the process in pure Ar and provide a layer being similar to the target composition or being closer to stoichiometric or even be over stoichiometric (x higher than 3) if excess oxygen is incorporated during the layer formation.

The radiation source used for the layers corresponding to the measurements shown in FIG. 4 is a broadband source. The radiation is sent through one side of the deposited layer, e.g. irradiating the surface of substrate that was not deposited in that step, or vice versa, and the transmittance is measured. The graph shows the spectral transmittance as percentage of radiation reaching the detector at the other side of the piece as compared with the case that no piece is present. The reference measurement, allowing to calibrate the source intensity and the detector (spectral) sensitivity is typically done in the gap in between 2 pieces passing in the sensing zone.

It can be clearly seen that, when the content of oxygen in the sputtering environment is 50 sccm or higher, the deposited layers have approximately the same maximum transmittance, with interference peaks showing a maximum transmittance slightly above 90% and a midrange close to 80%. These maxima of the interference pattern correspond with the transmittance of the piece entering the coating zone, being a flat glass substrate in this case. It can be safely assumed that the layers deposited with contents of 50 sccm and over are substantially transparent to radiation with a wavelength over 400 nm. It can be also inferred that the layer contains mainly stoichiometric tungsten oxide $WO_3$.

However, for contents of 40 sccm and lower, the maximum transmittance drops. At 40 sccm, for wavelengths over approximately 700 nm the transmittance is under 70%. The midrange also drops. For 35 sccm the maximum transmittance is seen at around 400 nm under 70% and the transmittance of wavelengths of around 600 nm already drops under 50%. The lowest relative minimum transmittance takes place for radiation of 1000 nm wavelength, with less than 30% radiation. At best case scenario, there is a drop of 10% of transmittance (both maximum and midrange) at around 500 nm, and around 35% for radiation of 800 nm, with a change of oxygen content of only 5 sccm.

The trend continues at 30 sccm with an absolute maximum transmittance under 50%. A layer deposited with oxygen contents of 25 sccm and 20 sccm show a maximum transmittance under 30% and under 15% respectively. Overall, there is a drop of 60% transmittance, between almost 80% and almost 15%, for a wavelength of around 400 nm, when the oxygen content drops from 40 sccm to 20 sccm.

The following table shows the oxygen content (x-value) of a deposited layer measured by Electron Microprobe Analyzer, and the layer thickness, for different oxygen flow value (in sccm) in the sputter environment.

TABLE

Content of oxygen in atomic ratio tungsten/oxygen and thickness vs oxygen flow

| $O_2$ flow (sccm) | x-value | Thickness (nm) |
|---|---|---|
| 0 | 2.08 | |
| 15 | 2.55 | |
| 20 | 2.8 | 666 |
| 25 | 2.88 | 630 |
| 30 | 2.96 | 620 |
| 35 | 2.98 | 571 |
| 40 | 2.99 | 555 |
| 50 | 3 | 506 |
| 60 | 3 | 452 |
| 80 | 3 | 355 |
| 100 | 3 | 293 |

Hence, it is possible to accurately control the transmittance by controlling the oxygen content in the layer for a given layer thickness, which in turn can serve as an accurate indicator of layer composition.

It is also of note that for oxygen content under 35% in the chamber, the obtained layers are more absorbing for radiation over 750 nm. In fact for layers deposited in chambers with 25 sccm or 20 sccm, the layers have 0% transmittance, thus completely opaque, for radiation over approximately 750 nm. When looking through these samples, they exhibit a blueish appearance, getting darker with lower oxygen flow.

FIG. 4 shows an extremely high resolution in differentiating different compositions of a $WO_X$ layer with an x-value ranging from 2.8 to 3. For the graph shown, it would seem that it becomes much harder or impossible to estimate the x-value between e.g. 2.1 and 2.8 while the transmission of a layer having an x-value of 2.55 has a transmittance being lower than 1%. However, additional tests have shown that this is not necessarily the case. The loss of resolution at lower oxygen flows and lower x-values in the shown case is caused by the high relative thickness of 600 nm (measured by analytical lab equipment, e.g. Dektak step measurements). Reducing the layer thickness to e.g. 200 nm or lower (which is more common in multi layer optical stacks) will exponentially increase the transmittance and will allow to introduce a higher sensitivity in the more substoichiometric compositions; e.g. between 2.3 and 2.8 and for flows between 5 and 20 sccm of oxygen in the case of $WO_X$. On the other hand, the displayed resolution and extreme sensitivity now shown for compositions between 2.96 (30 sccm O2 flow) and 3.00 (at least 50 sccm O2 flow) decreases at smaller layer thickness while it will approach the transparent state.

Moreover, the transmission pattern formed by the transmitted radiation shows maxima and minima for different wavelength values. It is possible to extract information related to the thickness of the deposited layer from this pattern. This is a typical effect of optical interference from a layer with a specific refractive index being deposited on a piece having a different refractive index. Radiation is reflected on the top surface and on the surface of the piece after travelling through the layer. The total reflected radiation may exhibit constructive interference for some wavelengths and destructive interference for others because the optical path travelled from the radiation is different. The path difference depends on the refractive index and the thickness of the top layer, and combined with the angle of incidence. The reflectance may show color fringes similar to the ones from an oil drop on a water surface. Since the reflectance becomes wavelength-dependent and assuming a neutral or steady decaying absorptance with wavelength, the transmittance will exhibit the inverse interference pattern (because A+R+T=1). The optical thickness of the top layer may be calculated out of the wavelengths at which maxima and/or minima occur. The amplitude of the interference (difference in transmittance or reflectance of maxima relative to minima) may allow to calculate the refractive index. From FIG. 4 it can be inferred that the layers deposited with 50 sccm or higher are in fact transparent with a similar refractive index, but having a different layer thickness (change in wavelength spacing between extrema).

The transmittance response for the layers deposited with an oxygen flow of 40 sccm or lower show that some absorptance takes place. This is a typical metallic behavior and becomes more dominant at lower x-values; where excess metal relative to the stoichiometric dielectric layer is present. More metal fraction will exhibit more absorptance and lower transmittance. In this case, transmittance is being governed by the total amount of metallic-state zones or particles that have to be crossed by the radiation. So the transmittance level is defined by the absorptance level of the material; meaning its composition (or x-value in MOx) and its thickness.

The following parameters can also be obtained from the measurement. A non-stoichiometric layer with known x-value and thickness changes in a specific way when the porosity increases, which can be seen as a decrease of density. For high oxygen content (transparent layers) the minima intensity of the interference pattern increases reducing its amplitude. Materials with very low density eventually do not display interference pattern, similarly to the behaviour where there is no layer. This will be explained below with reference to the aspect of the processor for analysis of results.

Other properties, such as extinction coefficient, optical index, etc. can also be obtained, e.g. from the spectral information, and optimized in further deposition steps from the transmission measurement by adapting sputtering conditions.

In some embodiments, depositing metal comprises depositing tungsten and nickel, for example using a target comprising said metals, e.g. an alloy thereof.

The method may be applied in a multi-zone coater. A multi-zone coater is a sputtering system or installation with a plurality of stages or zones, including compartments as previously defined with reference to FIG. 3, where sputtering steps are performed. Each zone includes a target assembly to provide sputtering, for example one or two tubular targets. The stages may be maintained under a controlled environment, for example in a plurality of sputtering chambers. If required, they may be isolated so the environment in each chamber can be independently controlled, and/or so as to avoid cross contamination of gases leaking from one compartment to the other. Some targets need to be sputtered in pure Ar gas as to deposit a layer with similar composition as the target material. In some applications, the presence of certain reactive gas may have a detrimental effect in poisoning the target surface or contaminating the layer being deposited. A transport system allows introducing substrates in the installation and also transports the pieces (e.g. the substrates or at least partially coated substrates) from one stage to the next, until the coating process is finished and can be taken from the installation. Such transport may include moving platforms, chains, conveyor belt, etc.

In summary, the method includes providing 101 the piece, e.g. by bringing a piece to a sputtering zone, depositing 102 a layer on the piece, and measuring 103 the transmittance of the layer and the rest of piece on which the layer is deposited. The method includes changing 105 the parameters of the sputtering process in the sputtering zone after comparing 104 the measurement with the desired range if the transmittance is outside an acceptable range, so that the following piece can be sputtered with parameters closer to the ideal ones. This establishes a feedback loop in the method for improving the sputtering parameters of a required layer to obtain the desired transparency and, hence, the desired layer characteristics.

In some embodiments, the piece can be measured 107 before deposition, thereby setting the baseline of the transmittance of the substrate and any coating already present before depositing the new layer as explained earlier. In particular, a measurement may be performed between one stage and the other in a multi-zone coater. For example a measurement can be performed between two sputtering steps, for example between two sputtering stages or compartments, e.g. a measurement between each sputtering step.

In a further aspect, the present invention relates to a processor 305 or processing unit including data input port or ports for receiving radiation transmittance measurements. The processor includes control data output ports for sending control signals to a sputtering device, for controlling the sputtering process. The processor is programmed for, when receiving the radiation transmittance measurements, process the data and execute at least the step of comparison, and send control data output for controlling sputtering process parameters (for example, gas composition, e.g. oxygen content in the sputtering chamber, the present invention not being limited thereto). The processor can also control other steps such as deposition and impinging radiation.

The processor 305 may have access to a memory, e.g. a data port for accessing a lookup table, e.g. a memory unit 306, with a desired transmittance value or range thereof. It may include data linking values of transmittance with chemical compositions. For example, a set of transmittance values may be linked with respective oxygen contents of suboxidic compositions of a predetermined metal oxide. The processor may be programmed to output data and show chemical composition in a user interface device such as a screen or the like.

Figure 5:
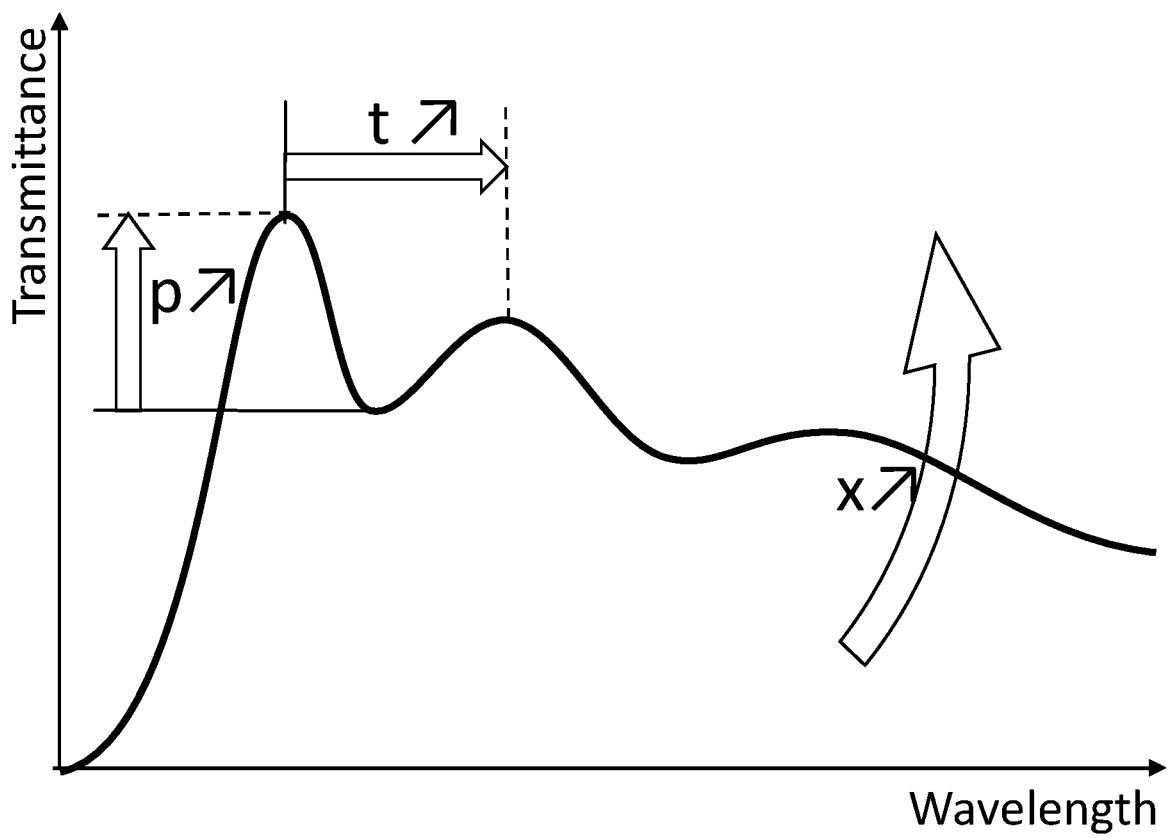
FIG. 5 is a graph illustrating the generic response of the transmittance as a function of wavelength indicating the effect of changing layer thickness (t), layer composition (x) and layer porosity (p)

The processor 305 may be equipped with software allowing to run simple or complex algorithms, based on analytical models or self learning models and incorporating machine learning from historical data. Several algorithms may run sequentially or in parallel as to capture the maximum possible information from the transmission data that is being provided. A generic approach on how an algorithm may function as to extract layer properties of a deposited $MR_X$ layer is shown in FIG. 5, where x is lower than the index of stoichiometry. Qualitative interpretation can be brought to accurate quantitative calculation of layer properties such as layer thickness t, layer composition x, or layer porosity p.

In this example, the algorithm is fed with a single spectral transmittance measurement without using reference data or baseline measurements. In this case of illustration, but not limited to such a model or concept, the algorithm may try extracting various properties and accurate values of the deposited non-stoichiometric oxide layer. As part of the analysis, the algorithm may detect several maxima and minima in the curve, being caused by interference. Any consecutive extrema may allow calculating the layer thickness. If several extrema occur in the graph, a consistency check may be executed, for improving the accuracy. If adjacent maxima get closer to each other (as shown in the graph); i.e. if the solid vertical line closes in towards the dotted vertical line, this indicates increase of the layer thickness t. The overall shape of the transmission curve or the integrated transmittance value may indicate the level of non-stoichiometry of the oxide layer. If the x-value in $MR_X$ approaches the stoichiometric index, a dielectric layer with high transmittance is observed. If the x-value falls further below the index of the stoichiometric compound, meaning that an increasing fraction of metal is present in the layer, then the overall transmittance will decrease exponentially with an increasing layer thickness (being defined by another curve characterisitics).

The curved arrow in the graph shows the evolution of the graph in case of increasing x-value. Defining porosity of the studied layer needs further analysis. It has been observed that a non-stoichiometric layer with known x-value and thickness will change in a specific way when the porosity is increased (density is being reduced). In this case, two distinct changes of the curve can be noticed, stemming from increased porosity. Within the more dielectric behavior (for higher x-values in $MR_X$), the minima of the interference pattern creep upwards as indicated on the graph: the solid horizontal line moves towards the dotted line. In cases of extreme low density, the interference pattern may disappear and reach a high transmittance as if no layer is being present, corresponding with the limit of no density. Within the more mixed composition in which metallic absorption is being noticed (for lower x values in the $MR_X$ layer), the transmittance curve for a layer with known x-value and thickness shifts to higher values. Indeed, since less absorbing particles are present in a less dense layer, the radiation is more easily transmitted. In this case, the upward arrow for the porosity in the graph will affect the whole curve and not only the minima.

In parallel, a different algorithm may run to translate the observed changes in layer properties towards the choice of process parameters, to adjust the layer in order to return to the desired nominal layer properties. This may require tuning of single or multiple parameters, locally or globally in the sputter compartment to realize the adjustment that is required.

Furthermore, the algorithm may take into account that most parameters may have interlinked responses. For example, the processor may include additional inputs from one or more sensory systems across the piece for detecting, for example, thickness. If at a specific location on the piece the layer appears too thin, the processor may take control and increase the sputtering power as to increase the amount of particles leaving the target and finally resulting in increasing layer thickness. However, at the same moment the reactive gas partial pressure may fall because more metallic particles are brought into the plasma, reacting with the available reactive gas balance and reducing the available amount of reactive gas for the $MR_X$ formation. As a result, the x-value may be impacted and reduced while at the same time the layer thickness is increased. This may be all taken into account by the algorithm running in the processor.

In parallel, yet another artificial intelligence algorithm may run based on machine learning to understand and control the sensitivity of each of the sputter parameters under the given conditions and environment. If it is required to tweak a specific parameter, the amount of adjustment can be adapted in such a way that a critical and accurate amount of control is executed. A too small adjustment would take too long, and several pieces may be sputtered in suboptimal conditions before the desired condition and layer performance is re-established. On the other hand, overshooting the adjustment may bring the process to oscillation and completely out of control. A self-learning algorithm may provide the intelligence for fast and accurate process tuning.

In a further aspect, the present invention relates to a coater such as a coater shown in FIG. 3, or for example a multi-zone coater, comprising sensing means for sensing the transmittance, control means for controlling the process parameters in accordance to the measurements of the sensing means, and optionally a readout for providing control values of the layer within certain tolerance levels (e.g. the chemical composition of the deposited layer) based on the transmittance measurement. The coater may comprise a processor 305 configured to perform steps of the method of the first aspect of the present invention including, but not limited to, signal processing and comparison with stored values.

Figure 6:
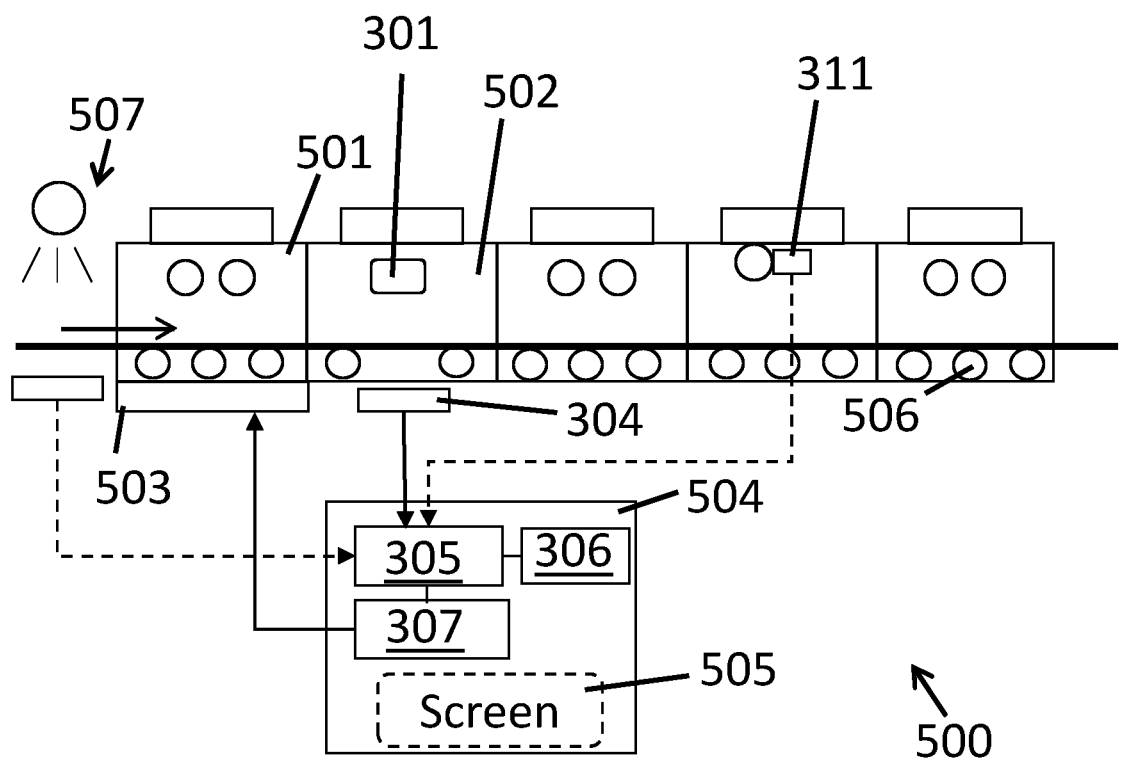
FIG. 6 illustrates a multi-zone coater in accordance with embodiments of the present invention.

FIG. 6 shows a coater 500 comprising several sputtering zones 501 with respective target assemblies. This sputtering zone may comprise for example a coater compartment 308 as shown in FIG. 3, with tubular targets, planar targets, etc. The coater comprises a downstream measurement region 502 comprising suitable sensing system such as a radiation source 301 (e.g. a LED, multiple LEDs), and a sensor 304 (e.g. integrating sensor such as a spectrometer, a photodiode or the like, which may be synchronized with the radiation source or sources, or an spectral analyzer). The sensor 304 generates a signal which depends on the radiation received, which was transmitted through the coated layer or layer stack 302 and substrate 303.

The coater may comprise a sensing system 311 which measures the intensity reflected through the layer, from which transmission data can be obtained, as explained earlier.

An electronic processor 305 receives the signal from the sensor 304. The processor is adapted to process the measurement. The processed signal can be compared to a transmittance value or set of values which may be stored in a memory unit 306 which may be integrated or connected to the processor. Depending on the results of the comparison, the processor may generate and send a signal to a controller 307 to control the sputtering parameters. The parameters of sputtering of the next piece are then adapted and optimized. The specific parameter and the amount of variation of the sputtering parameter may be chosen accordingly to the difference between the measured and expected transmittance parameter. For example, the parameter may be the percentage of radiation transmission for a predetermined range of wavelengths. The difference between the measured and expected parameter can be linked to the amount of variation in a sputter parameter, e.g. gas flow, that will be used in the next iteration. This can be calibrated, obtained experimentally or by theoretical models, etc.

Optionally, the coater may be adapted to provide a first coating, then to measure transmittance, and if the transmittance is different than expected, adapt the sputtering conditions of a following sputtering zone, so a further coating of the same or different materials may be applied with optimized conditions, if required. It is also possible to measure behind multiple sputter compartments of the same material, to make sure that the whole layer has the desired properties. In this case, one of the sputter compartments can be equipped with additional tuning mechanisms (e.g. online controllable magnetic system, having an array of servo drives for controlling the local plasma density very accurately) to allow compensation for other zones that are introducing some drift or deviation.

At least one of the sputtering zones includes means of controlling the deposition conditions, for example the sputtering power, etc. These means may include actuators 503 or the like. In some embodiments, the controller 307 and actuators 503 are adapted to control the amount and composition of gasses and pressures of the environment, e.g. by controlling mechanical valves and pumps to introduce predetermined gas, such as oxygen, in an accurate and predetermined amount. The zones may be isolated from the exterior and/or from each other in case there are multiple zones (multi-coater) with valves, shields, gates etc. The sputtering process is controlled in a feedback loop as a response to the measurements of the sensing system.

In some embodiments, any or each of the processor 305, memory unit 306 and controller 307 may be part of a computer system 504. Said computer system 504 may include user interfaces and outputs, for example a screen 505 for displaying the transmittance values measured by the sensing system, and optionally the chemical compositions of the deposited layer linked thereto. The memory unit 306 or a different memory unit, e.g. external unit, can be used also to store these measured values and optionally chemical compositions.

A transport system 506 (moving platforms, chains, a conveyor belt, etc.) allows introducing and transporting the pieces into the coater and between different zones or stage of the coater. The system may bring new pieces to the chamber for deposition, or may be a rotational configuration which allows cyclic sputtering on the same pieces, see FIG. 7, FIG. 8.

The multi-zone coater may comprise a measurement region at least after one sputtering stage, for example after a plurality of sputtering stages, e.g. after each sputtering stage. The (at least one) measurement zone or region may include a sensing system as explained earlier. In some embodiments the sputtering conditions, including the environmental conditions, of different stages may be controlled differently, e.g. the environmental composition (such as amount of oxygen) may be different and controlled differently in one stage than in another.

The multi-zone coater may have a first measurement region 507 before the first sputtering stage, if the baseline of the piece to be coated should be known. This may happen in cases of a piece or substrate which may have a transmittance deviating from the theoretical value, or simply not known.

The measurement region 507 allows to check if the piece is according to expectations and the measurement region 502 behind allows to analyse the impact of the last layer, being the $MR_x$. It is possible to use two sensing systems which may be both located in the coater, for example on the lid of one of the compartments of the coater, in particular on the compartment or compartments for measurement. Thus the coater may include one or more sputtering zones 501 and a sensing system may be in the coater at least behind a sputtering zone or compartment, optionally before a sputtering zone, optionally in between coating compartments, even behind the coater (e.g. while the piece is leaving or has left the coater).

Figure 7:
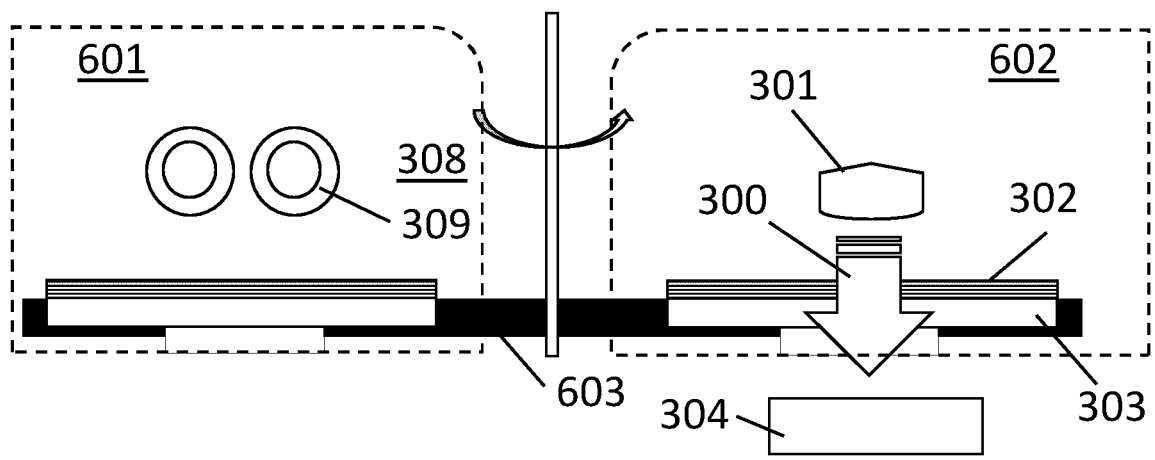
FIG. 7 is a side view of a rotating disk coater in accordance with embodiments of the present invention for providing layers of different or the same composition in several stages to different pieces or to the same piece.

FIG. 7 shows the alternative transport system 603 of a coater in accordance with embodiments of the present invention. FIG. 7 shows a side view of a rotating disk with openings, for mounting several pieces: one coat zone 601 and one measurement region or zone 602 is shown, however several coat and measurement zones may be present. In order to provide a layer of a single composition/material, at least one coat zone 601 is activated. For example, realizing the desired coating may require many revolutions of the carrier plate to finish the desired layer properties (e.g. thickness, composition, porosity, . . . ). For every fractional layer being deposited per revolution, a transmittance measurement may be executed to tweak the deposition process parameters on the spot. After the deposition the rotating disk serving as transport system 603 is rotated so the piece enters the measurement zone, which as before may be isolated from the coat zone 601. For making a multilayer (of different composition), various coat zones may be activated sequentially and the same measurement system may be used between depositions on the same piece, thus forming a stack.

Figure 8:
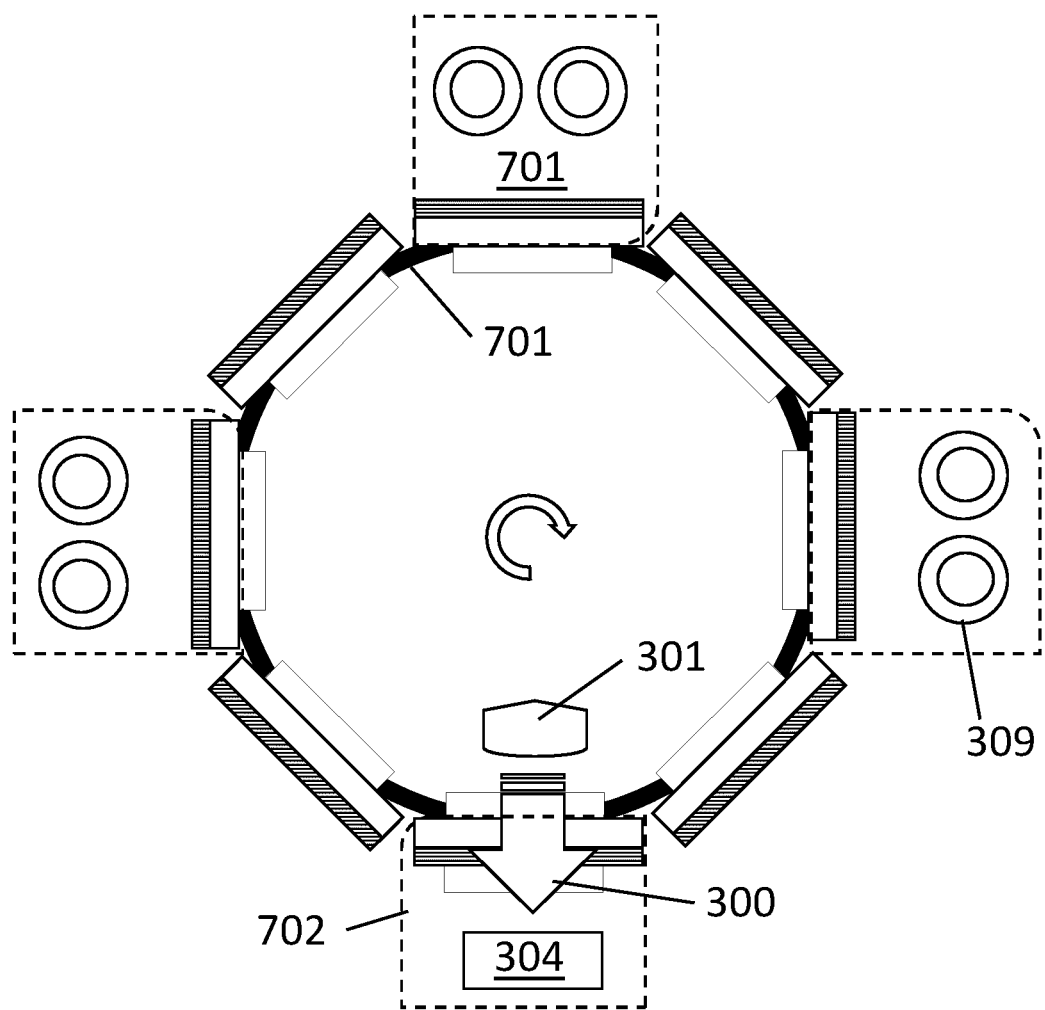
FIG. 8 is a top view of a drum multi-zone coater in accordance with embodiments of the present invention for providing layers of different or the same composition in several stages to multiple pieces.

FIG. 8 shows an alternative embodiment with a different transport system 703 where instead of a disk or a belt, a drum is used. The figure shows a top view of a rotating drum, with openings, for mounting several pieces (e.g. 8 as shown): several coat zones 701 (e.g. 3 shown) and one measurement zone 702 is shown. Including more measurement zones, optionally more coat zones, may increase the speed of parallelized processing and deposition. As before, the measurement and coat zones may be enclosed so sputter material does not affect sensors and/or radiation sources in the measurement zone(s).

For making a layer of a single composition/material, at least one coat zone is active and may require many revolutions of the carrier drum to finish the desired layer properties (e.g. thickness, composition, porosity, . . . ). For every fractional layer being deposited per revolution, the piece can be moved to the measurement zone by rotation of the drum, and a transmittance measurement may be executed to tweak the deposition process parameters on the spot.

For making a multilayer (of different composition), the various coat zones may be activated sequentially and the same measurement system may be used.

The present invention allows using radiation transmittance to adapt and optimize sputtering conditions of metal compound layers, in particular, requiring a layer having a specific non-stoichiometric x-value, e.g. for sub-stoichiometric metal oxides e.g. being between 80% and 99% of the stoichiometric index compound composition, preferably between 85% and 98% of the stoichiometric index compound composition. In particular, this is applied to materials whose radiation transmittance as a deposited layer changes with composition. These may include tungsten oxides, nickel tungsten oxides, titanium oxides, zirconium oxides, indium oxides, tin oxides, tantalum oxides, niobium oxides and most other oxides of transition metals. These may include silicon nitrides, aluminum nitrides and some other nitrides of metallic elements. The same may be applicable to carbides or mixed compounds having a metal and multiple reactive compounds; e.g. containing at least 2 of oxygen, nitrogen, carbon and/or boron.

Additionally for the control of transmittance, it is possible to control composition due to the accurate transmittance that slight compositional variations show. The present invention also allows using the same measurement to obtain layer thickness or density as seen above, e.g. by using broadband radiation and spectral measurements.

Figure 9:
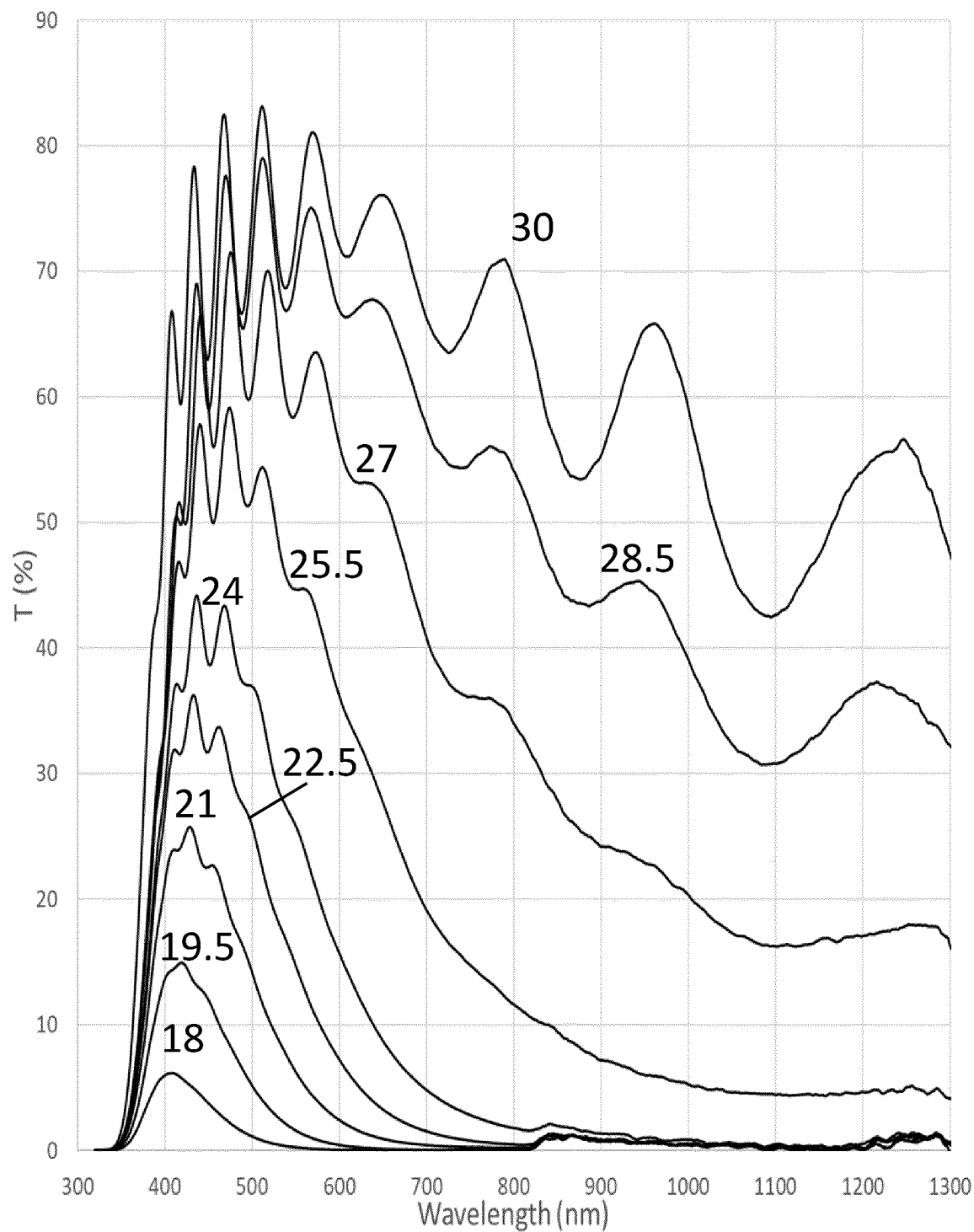
FIG. 9 is a graph similar to that of FIG. 4, showing the transmission spectrum in wavelengths for several layers provided under different oxygen flows and total pressure.

FIG. 9 shows the transmission spectrum in wavelengths for several layers provided under different oxygen flows, from 18 to 30 sccm and for a much higher total pressure. The layers are thick $WO_X$ layers close to 900 nm, which are much thicker and more porous than those shown in FIG. 4. In particular, more interference peaks in the spectrum indicate a thicker layer as the spacing in the peaks allows for thickness calculation. The increased porosity results in higher transmittance for these substoichiometric layers and a reduced interference amplitude compared to layers in FIG. 4; reduced absorption at lower oxygen flows, because less absorbing mass is present. The x value is expected to fall between 2.7 and 2.95.

The curve with with a transmittance close to 40%, corresponding to gas flows of 30 sccm in FIGS. 4 and 24 sccm in FIG. 9, has a different interference amplitude. This confirms the effect of less amplitude for more porous layers.

It can be assumed that the oxygen flow determines the composition or x-value of the metal compound in the layer. Comparing FIG. 9 and FIG. 4 again, for the same oxygen flow (and hence similar x-value), higher transmittance is found in FIG. 9. Also FIG. 9 shows more fringes than FIG. 4 for each curve, so the layer in FIG. 9 is thicker. Hence, it can be deduced that the layer which gave the results of FIG. 9 presents higher porosity than the one corresponding to FIG. 4.

In summary, the graphs in FIG. 4 and FIG. 9 show that the overall transmittance or spectrally resolved transmission changes largely with oxygen flow, allowing accurate control of the composition.

The present invention takes advantage of the fact that sub-stoichiometric layers of most oxide materials show spectral absorption (less transmission relative to its stoichiometric reference), while having excess oxygen (super-stoichiometry) usually does not make the layer more transparent and thus will not allow to control the x above its stoichiometric index value.

The majority of examples discussed in the foregoing relate to methods and devices for providing metal oxide layers with controllable degrees of transmittance by, not only thickness control, but also control of the composition of the layer, specifically the amount of oxygen in the deposited layer. However, the same methodology may be used with other reactive gases, for example during the deposition of other metal compounds, e.g. nitrides, carbides, etc. Although many metal nitride layers exhibit metallic properties in the UV, VIS and NIR wavelengths, it is known that some nitrides yield transparent coatings. For example, the present invention can be used to provide layers comprising wide bandgap subnitrides: e.g. $SiN_X$, $AlN_X$, $BN_X$. For example, sputtering of Si or Al layers in Ar gas, results in absorbing layers, while sputter deposition of $Si_3N_4$ or AN from a target containing respectively Si or Al metal by using a gas ambient containing nitrogen, results in transparent coatings, or at least coating with a non-zero transparency for at least visible radiation, that may interfere with other layers of the piece. Thus, the present invention can be used to provide non-stoichiometric $SiN_X$ layers, for example. Similar analysis may be performed from measuring the transmittance and the mix of non-stoichiometric, stoichiometric and metallic compounds can be quantified and controlled by this optical measurement. The present invention allows the deposition of $MO_XN_Y$ (metal oxynitride), where M can e.g. be Ti, Si, Al, B amongst many other metallic materials. By adding metal nitrides, most practical sputtered layers may be covered. Any other metal compounds, whose thin layer show at least partially transparency, can be deposited using this technique. For example some metal carbides may exhibit transparency as well, and again the method and devices of the present invention may be used to define layer composition, thickness and density. Amongst the carbides having shown some transparency as thin film belong silicon carbide and titanium carbide. Hence, non-stoichiometric carbides can be also obtained by the present invention.

The invention claimed is:

1. A method of depositing a layer on a piece by sputter deposition, the method comprising:
   providing a metal compound layer by depositing metallic and reactive species simultaneously on a first piece for forming a layer under predetermined sputtering conditions, thereby providing a deposited layer on the first piece comprising the metal compound,
   subsequently irradiating the deposited layer on the first piece and measuring optical transmittance through at least the deposited layer, thus providing measurement signals,
   sending the measurement signals to a processor,
   performing spectral analysis of the measurement signals, and comparing a measured radiation parameter of the radiation transmitted with at least one stored value of the radiation parameter, the processor thus obtaining an indication of a layer thickness and of at least one of the following deposited layer characteristics:
   composition,
   optical constants consisting of refractive index and/or extinction coefficient, and
   density/porosity,
   adapting the predetermined sputtering conditions as a response of the comparison, and sputtering a second piece with adapted parameters, wherein the adapted sputtering conditions are provided to change one or more characteristics of a deposited layer on the second piece relative to the deposited layer of the first piece on which the measurement was made.

2. The method of claim 1, wherein depositing metallic species comprises providing a ceramic target comprising sub-stoichiometric metal compound for sputtering,
   optionally wherein providing a ceramic target comprises providing a metal oxide and/or nitride and/or carbide, for sputtering, optionally having a target material resistivity below 1000 Ohms·cm.

3. The method of claim 1, wherein the at least one stored value corresponds to a reference amount of reactive species in a non-stoichiometric compound of metal with the reactive species.

4. The method of claim 1, wherein the at least one stored value corresponds to a reference density of the compound of metal with a reactive species,
   optionally wherein the at least one stored value comprises values corresponding to a reference density and/or a reference amount of oxygen in an oxygen-deficient metal oxide.

5. The method of claim 1, wherein measuring optical transmittance comprises measuring radiation wavelength-resolved transmittance where
   impinging radiation comprises impinging radiation having a wavelength ranging from the wavelength of UV radiation up to the wavelength of IR radiation, or
   wherein measuring optical transmittance comprises measuring with an integrating sensor the transmittance of radiation generated by a plurality of sources with predetermined wavelength ranges, and/or by a broadband light source.

6. The method of claim 1, wherein providing sputter deposition of metal comprises providing sputter deposition of at least tungsten.

7. The method of claim 6, further comprising providing a target comprising at least one tungsten oxide.

8. The method of claim 7, wherein depositing a layer comprises depositing a tungsten oxide layer where the ratio of oxygen over tungsten is 2.3 or higher.

9. The method of claim 1 further comprising sputtering in presence of an gas ambient containing reactive species and/or gases, optionally wherein sputtering in presence of gas comprises sputtering in presence of a gas containing oxygen and/or nitrogen and/or carbon and an inert gas where the amount of inert gas is larger than the amount of reactive gas; the fraction of reactive gas flow relative to the total amount of injected gas flow into the sputter process is less than 50% of the total gas flow.

10. The method of claim 1, wherein controlling the predetermined sputtering conditions comprises controlling the conditions so that the deposited layer has a controlled transmittance being different than the transmittance of the stoichiometric counterpart of the material of the layer.

11. The method of claim 1, wherein controlling the sputtering parameters comprises controlling sputtering power, gas partial pressure or flow, and/or magnetic field strength.

12. The method of claim 1, further comprising measuring optical transmittance of the piece before providing sputter deposition for forming a deposited layer on the piece thereby providing a preliminary measurement, optionally further comprising controlling the predetermined sputtering conditions before providing sputter deposition as a response to the preliminary measurement.

13. The method of claim 1, wherein measuring optical transmittance comprises measuring in reflection mode with the sensor and the radiation source arranged at the same side of the piece.

14. A processor comprising input for introducing transmission measurement data, an output of data for actuator control for controlling sputter parameters, the processor being configured to perform at least the steps of comparing and adapting of the method of claim 1.

15. A sputter deposition coater including:
actuators for controlling sputter parameters,
a sensing system including a radiation source for sending radiation through a layer deposited on a substrate and a sensor for detecting radiation passing through that layer, the processor of claim 3 connectable to the sensing system and to the actuators for controlling the actuators in response to the measurements obtained from the sensing system.

16. The method of claim 1, wherein providing sputter deposition of metal comprises providing sputter deposition of at least nickel.

17. The method of claim 16, further comprising providing a target comprising at least a nickel-tungsten alloy.

18. The method of claim 1, wherein the second piece comprises the first piece and the deposited layer on the first piece.

* * * * *